United States Patent
Jiang et al.

(10) Patent No.: US 12,376,452 B2
(45) Date of Patent: Jul. 29, 2025

(54) DISPLAY MODULE STACK STRUCTURE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhiliang Jiang, Beijing (CN); Pan Zhao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 588 days.

(21) Appl. No.: 17/787,095

(22) PCT Filed: Aug. 16, 2021

(86) PCT No.: PCT/CN2021/112652
§ 371 (c)(1),
(2) Date: Jun. 17, 2022

(87) PCT Pub. No.: WO2022/062765
PCT Pub. Date: Mar. 31, 2022

(65) Prior Publication Data
US 2023/0040918 A1    Feb. 9, 2023

(30) Foreign Application Priority Data
Sep. 28, 2020   (CN) .......................... 202011045659.0

(51) Int. Cl.
G09F 9/30       (2006.01)
G02B 1/14       (2015.01)
(Continued)

(52) U.S. Cl.
CPC ............... *H10K 50/86* (2023.02); *G02B 1/14* (2015.01); *G02B 5/3025* (2013.01); *H10K 59/40* (2023.02);
(Continued)

(58) Field of Classification Search
CPC ............ H10K 2102/311; H10K 59/40; H10K 77/111; G09F 9/301
See application file for complete search history.

(56) References Cited

U.S. PATENT DOCUMENTS 6,717,358 B1 *   4/2004   Liao ...................... H10K 50/19
                                                   428/917
2015/0357597 A1   12/2015   Wang
(Continued)

FOREIGN PATENT DOCUMENTS

CN       103682154 A       3/2014
CN       103682155 A       3/2014
(Continued)

OTHER PUBLICATIONS

PCT/CN2021/112652 international search report and written opinion.
CN 202011045659.0 first office action dated Mar. 22, 2025.

*Primary Examiner* — Joseph L Williams
(74) *Attorney, Agent, or Firm* — IPro, PLLC

(57) ABSTRACT

The present disclosure provides a display module stack structure and a display device. The display module stack structure includes: a flexible display panel module including a light-exiting surface and a back surface opposite to the light-exiting surface; a polarization layer stacked on one side of the light-exiting surface of the flexible display panel module; a first adhesive layer stacked on one side of the polarization layer away from the flexible display panel module; a protection cover plate stacked on one side of the first adhesive layer away from the flexible display panel
(Continued)

module; a second adhesive layer stacked on one side of the back surface of the flexible display panel module; a protection layer stacked on one side of the second adhesive layer away from the flexible display panel module; and a resilient layer stacked on one side of the protection layer away from the second adhesive layer.

19 Claims, 1 Drawing Sheet

(51) Int. Cl.
    *G02B 5/30*      (2006.01)
    *H10K 50/86*     (2023.01)
    *H10K 59/40*     (2023.01)
    *H10K 77/10*     (2023.01)
    *H10K 102/00*    (2023.01)

(52) U.S. Cl.
    CPC ...... *H10K 77/111* (2023.02); *H10K 2102/311* (2023.02); *H10K 2102/351* (2023.02)

(56) References Cited

U.S. PATENT DOCUMENTS

| 2016/0049614 | A1 | 2/2016 | Gao et al. |
| 2017/0336831 | A1* | 11/2017 | Zhang .................. G06F 3/0446 |
| 2021/0136933 | A1* | 5/2021 | Smeeton ................. B32B 15/06 |
| 2021/0167157 | A1 | 6/2021 | Cao et al. |
| 2022/0367822 | A1* | 11/2022 | Boardman ............. H10K 59/40 |

FOREIGN PATENT DOCUMENTS

| CN | 106373983 A | 2/2017 |
| CN | 107037627 A | 8/2017 |
| CN | 108493212 A | 9/2018 |
| CN | 109817684 A | 5/2019 |
| CN | 109904207 A | 6/2019 |
| CN | 110783389 A | 2/2020 |
| CN | 110969939 A | 4/2020 |
| CN | 210639895 U | 5/2020 |
| CN | 111416057 A | 7/2020 |
| CN | 212229977 U | 12/2020 |
| IN | 112017547 A | 12/2020 |

\* cited by examiner

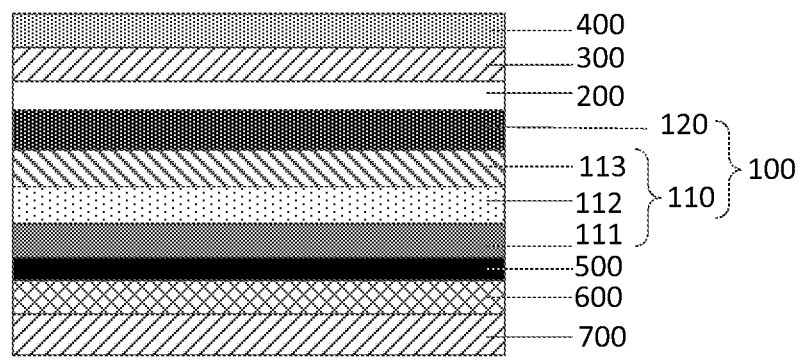

DISPLAY MODULE STACK STRUCTURE AND DISPLAY DEVICE

CROSS-REFERENCE TO RELATED APPLICATIONS

This application claims a priority of the Chinese Patent Application No. 202011045659.0 filed on Sep. 28, 2020, which is incorporated herein by reference in its entirety.

TECHNICAL FIELD

The present disclosure relates to the field of display technology, in particular to a display module stack structure and a display device.

BACKGROUND

In the related art, a foldable display product is inwardly foldable or outwardly foldable. When the display product is outwardly foldable, it is unnecessary to provide a secondary panel, so it has attracted more attentions in terms of the manufacture cost and the usage as compared with the inwardly foldable display product. However, during the folding, a flexible display panel of the outwardly foldable display product is located at a periphery, and a large stress is applied to the flexible display panel, so cracks easily occur. At this time, moisture and oxygen enter a light-emitting layer, so black spots occur for the display panel and thereby the performance of the display panel is severely adversely affected. Hence, it is crucially important to design a display module (MDL) stack structure for the outwardly foldable display product.

SUMMARY

An object of the present disclosure is to provide a display module stack structure and a display device, so as to reduce a stress and improve the performance of the foldable display product.

In order to achieve the above-mentioned purpose, the present disclosure provides the following technical solutions.

In one aspect, the present disclosure provides In some embodiments of the present disclosure a display module stack structure, including: a flexible display panel module including a light-exiting surface and a back surface opposite to the light-exiting surface; a polarization layer stacked on one side of the light-exiting surface of the flexible display panel module; a first adhesive layer stacked on one side of the polarization layer away from the flexible display panel module; a protection cover plate stacked on one side of the first adhesive layer away from the flexible display panel module; a second adhesive layer stacked on one side of the back surface of the flexible display panel module; a protection layer stacked on one side of the second adhesive layer away from the flexible display panel module; and a resilient layer stacked on one side of the protection layer away from the second adhesive layer.

In a possible embodiment of the present disclosure, the polarization layer has a thickness of 100 μm to 110 μm in a direction perpendicular to the light-exiting surface and an elastic modulus of $2.0 \times 10^9$ pa to $2.8 \times 10^9$ pa.

In a possible embodiment of the present disclosure, the first adhesive layer has a thickness of 45 μm to 55 μm in a direction perpendicular to the light-exiting surface and an elastic modulus of $3 \times 10^4$ pa to $3.6 \times 10^4$ pa.

In a possible embodiment of the present disclosure, the protection cover plate has a thickness of 90 μm to 110 μm in a direction perpendicular to the light-exiting surface and an elastic modulus of $5.19 \times 10^9$ pa to $5.67 \times 10^9$ pa.

In a possible embodiment of the present disclosure, the second adhesive layer has a thickness of 11 μm to 15 μm in a direction perpendicular to the light-exiting surface and an elastic modulus of $1.7 \times 10^5$ pa to $2.0 \times 10^5$ pa.

In a possible embodiment of the present disclosure, the protection layer has a thickness of 45 μm to 55 μm in a direction perpendicular to the light-exiting surface and an elastic modulus of $3.0 \times 10^9$ to pa $3.5 \times 10^9$ pa.

In a possible embodiment of the present disclosure, the resilient layer has a thickness of 90 μm to 100 μm in a direction perpendicular to the light-exiting surface and an elastic modulus of $1.6 \times 10^{11}$ to pa $1.9 \times 10^{11}$ pa.

In a possible embodiment of the present disclosure, the second adhesive layer is made of at least one of a styrene-acrylonitrile copolymer, a styrene-isoprene-styrene block copolymer and a styrene-butadiene-styrene block copolymer.

In a possible embodiment of the present disclosure, the protection layer is made of polyimide.

In a possible embodiment of the present disclosure, the resilient layer is a stainless steel sheet.

In a possible embodiment of the present disclosure, the first adhesive layer is made of one or more of silicone, acrylic resin, unsaturated polyester, polyurethane and epoxy resin.

In a possible embodiment of the present disclosure, the protection cover plate is a single-layer glass cover plate, a single-layer plastic cover plate, a lamination structure including at least two plastic film layers, or a lamination structure including a plastic substrate and a glass substrate.

In a possible embodiment of the present disclosure, the flexible display panel module includes a flexible display panel and a touch panel, and each of the flexible display panel and the touch panel includes an inorganic film layer.

In a possible embodiment of the present disclosure, the flexible display panel includes a base substrate, an electroluminescent layer formed on the base substrate, and an encapsulation layer for encapsulating the electroluminescent layer, and the inorganic film layer is included at least in the encapsulation layer.

In another aspect, the present disclosure provides in some embodiments of the present disclosure a display device including the above-mentioned display module stack structure.

The present disclosure has the following beneficial effects.

According to the embodiments of the present disclosure, it is able to provide the display module stack structure with a low stress, thereby to improve the performance of a foldable display product.

BRIEF DESCRIPTION OF THE DRAWINGS

FIG. 1 is a schematic view showing a display module stack structure according to one embodiment of the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The related art will be described before the detailed description on a display module stack structure and a display device in the embodiments of the present disclosure.

In the related art, a foldable display product is inwardly foldable or outwardly foldable. When the display product is outwardly foldable, it is unnecessary to provide a secondary panel, so it has attracted more attentions in terms of the manufacture cost and the usage as compared with the inwardly foldable display product. However, during the folding, a flexible display panel of the outwardly foldable display product is located at a periphery, and a large stress is applied to the flexible display panel. Especially, the flexible display panel includes an inorganic film layer, e.g., in an encapsulation layer. The inorganic film layer is fragile, so it is easily damaged under the effect of the stress. When cracks occur, moisture and oxygen enter a light-emitting layer, so black spots occur for the display panel and thereby the performance of the display panel is severely adversely affected. In addition, a stress condition of the inorganic film layer during the folding is closely associated with the display module stack structure. Hence, it is crucially important to design the display module stack structure for the display module, especially the outwardly foldable display product.

In order to solve the above-mentioned problems, as shown in FIG. 1, the present disclosure provides In some embodiments of the present disclosure a display module stack structure, which includes: a flexible display panel module 100 including a light-exiting surface and a back surface opposite to the light-exiting surface; a polarization layer 200 stacked on one side of the light-exiting surface of the flexible display panel module 100; a first adhesive layer 300 stacked on one side of the polarization layer 200 away from the flexible display panel module 100; a protection cover plate 400 stacked on one side of the first adhesive layer 300 away from the flexible display panel module 100; a second adhesive layer 500 stacked on one side of the back surface of the flexible display panel module 100; a protection layer 600 stacked on one side of the second adhesive layer 500 away from the flexible display panel module 100; and a resilient layer 700 stacked on one side of the protection layer 600 away from the second adhesive layer 500.

According to the embodiments of the present disclosure, it is able to provide the display module stack structure with a low stress, thereby to improve the performance of a foldable display panel. A plurality of film layers is stacked on each of the light-exiting surface and the back surface of the flexible display panel module 100, so that the flexible display panel module 100 is located at an intermediate layer. In this way, it is able to reduce a stress applied to an inorganic film layer in the flexible display panel module 100, thereby to prevent the inorganic film layer from being broken.

In some embodiments of the present disclosure, the flexible display panel module 100 includes a flexible display panel 110 and a touch panel 120, and an inorganic film layer is included in at least one of the flexible display panel 110 and the touch panel 120.

In some embodiments of the present disclosure, the flexible display panel 110 includes a base substrate 111, an electroluminescent layer 112 formed on the base substrate 111, and an encapsulation layer 113 for encapsulating the electroluminescent layer 112, and the inorganic film layer is included at least in the encapsulation layer 113. For example, the flexible display panel 110 is an Organic Light-Emitting Diode (OLED) display panel, or a Quantum-dot Light-Emitting Diode (QLED) display panel.

It should be appreciated that, the display module stack structure in the embodiments of the present disclosure is suitable for, but not limited to, an outwardly-foldable display product.

In some embodiments of the present disclosure, the polarization layer 200 has a thickness of 100 μm to 110 μm in a direction perpendicular to the light-exiting surface and an elastic modulus of $2.0 \times 10^9$ pa to $2.8 \times 10^9$ pa. The first adhesive layer 300 has a thickness of 45 μm to 55 μm, e.g., 50 μm, in the direction perpendicular to the light-exiting surface, and an elastic modulus of $3 \times 10^4$ pa to $3.6 \times 10^4$ pa. The protection cover plate 400 has a thickness of 90 μm to 110 μm in the direction perpendicular to the light-exiting surface and an elastic modulus of $5.19 \times 10^9$ pa to $5.67 \times 10^9$ pa. The second adhesive layer 500 has a thickness of 11 μm to 15 μm, e.g., 13 μm, in the direction perpendicular to the light-exiting surface, and an elastic modulus of $1.7 \times 10^5$ pa to $2.0 \times 10^5$ pa. The protection layer 600 has a thickness of 45 μm to 55 μm in the direction perpendicular to the light-exiting surface and an elastic modulus of $3.0 \times 10^9$ pa to $3.5 \times 10^9$ pa. The resilient layer 700 has a thickness of 90 μm to 100 μm in the direction perpendicular to the light-exiting surface and an elastic modulus of $1.6 \times 10^{11}$ pa to $1.9 \times 10^{11}$ pa.

In the embodiments of the present disclosure, the flexible display panel module 100 is located in the middle of the display module stack structure. Through designing the thickness and the elastic modulus of each film layer stacked on the light-exiting surface and the back surface of the flexible display panel module 100, it is able to optimize the performance of the display module stack structure.

For example, in some embodiments of the present disclosure, based on the above-mentioned display module stack structure, a maximum stress to be withstood by the inorganic film layer in the encapsulation layer 113 of the flexible display panel 110 and the inorganic film layer in the touch panel 120 is 90±10 Mpa during the bending, and when a folding radius is R5, the quantity of bending times is greater than or equal to 150 k.

In some embodiments of the present disclosure, the second adhesive layer 500 is a pressure-sensitive adhesive (PSA), e.g., a nanoscale adhesive. However, the second adhesive layer 500 is not limited thereto.

In addition, in some embodiments of the present disclosure, a third adhesive layer is further arranged between the protection layer and the resilient layer.

In addition, in the embodiments of the present disclosure, a material of each film layer is also optimized to optimize the performance, especially the bending resistance, of the display module stack structure.

For example, in a possible embodiment of the present disclosure, the second adhesive layer 500 is made of at least one of a styrene-acrylonitrile copolymer, a styrene-isoprene-styrene block copolymer and a styrene-butadiene-styrene block copolymer. The protection layer 600 is made of polyimide. The resilient layer 700 is a stainless steel sheet. The first adhesive layer 300 is made of one or more of silicone, acrylic resin, unsaturated polyester, polyurethane and epoxy resin. The protection cover plate 400 is a single-layer glass cover plate, a single-layer plastic cover plate, e.g., Colorless Polyimide (CPI), Polyethylene Terephthalate (PET), a lamination structure of at least two plastic film layers, e.g., a lamination structure including two CPI layers or two PET layers, or a lamination structure including a plastic substrate and a glass substrate, e.g., a lamination structure including a plastic substrate and ultra-thin glass (UTG) (the plastic substrate is arranged on a side of the ultra-thin glass away from a base substrate).

The present disclosure further provides in some embodiments a display device including the above-mentioned display module stack structure.

The display device may be any product or member having a display function, such as a liquid crystal television, a liquid crystal display, a digital photo frame, a mobile phone, or a tablet computer. The display device further includes a flexible circuit board, a printed circuit board and a back plate.

The present disclosure further provides in some embodiments a method for manufacturing the above-mentioned display module stack structure, which includes: step S01 of forming the flexible display panel module 100, the flexible display panel module 100 including a light-exiting surface and a back surface opposite to the light-exiting surface; Step S02 of forming the second adhesive layer 500 and the protection layer 600 stacked in sequence on the back surface of the flexible display panel module 100 from one side close to the flexible display panel module 100 to one side away from the flexible display panel module 100; Step S03 of forming the polarization layer 200, the first adhesive layer 300 and the protection cover plate 400 stacked in sequence on the light-exiting surface of the flexible display panel module 100 from one side close to the flexible display panel module 100 to one side away from the flexible display panel module 100; and Step S04 of forming the resilient layer 700 on one side of the protection layer 600 away from the flexible display panel module 100.

According to the method in the embodiments of the present disclosure, it is able to provide the display module stack structure with a low stress, thereby to improve the performance of the foldable display product.

It should be appreciated that, in the above-mentioned method, the second adhesive layer 500 and the protection layer 600 are formed on the back surface of the flexible display panel module 100, and then a polarizer, the first adhesive layer and the protection cover plate are formed on the light-exiting surface of the flexible display panel module 100. For the flexible display panel module 100, due to its flexibility, such a phenomenon as unevenness easily occurs, and the second adhesive layer 500 and the protection layer 600 on the back surface of the flexible display panel module 100 may serve as to support the flexible display panel module 100, so it is able to facilitate the arrangement of the polarizer, the first adhesive layer and the protection cover plate on the light-exiting surface of the flexible display panel module 100 subsequently.

In addition, when the polarizer, the first adhesive layer and the protection cover plate are arranged on the light-exiting surface of the flexible display panel module 100, alignment marks re provided on each film layer so as to facilitate the attachment. When the resilient layer 700 is arranged on the back surface of the flexible display panel module 100 first, the alignment marks may be shielded. Hence, after the arrangement of the polarizer, the first adhesive layer and the protection cover plate on the light-exiting surface of the flexible display panel module 100, the resilient layer 700 is arranged on the back surface of the flexible display panel module 100.

In the above-mentioned method, Step S02 specifically includes removing a release film on the protection layer 600 with the second adhesive layer 500, and directly attaching the protection layer 600 onto the back surface of the flexible display panel module 100 through the second adhesive layer 500.

In the above-mentioned method, Step S03 specifically includes attaching the polarizer 200 onto the light-exiting surface of the flexible display panel module 100, removing a release film of the first adhesive layer 300 and attaching the first adhesive layer 300 onto the polarizer 200, and attaching the protection cover plate 400 onto the first adhesive layer 300.

Some explanations will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display module stack structure, comprising:
 a flexible display panel module comprising a light-exiting surface and a back surface opposite to the light-exiting surface;
 a polarization layer stacked on one side of the light-exiting surface of the flexible display panel module;
 a first adhesive layer stacked on one side of the polarization layer away from the flexible display panel module;
 a protection cover plate stacked on one side of the first adhesive layer away from the flexible display panel module;

a second adhesive layer stacked on one side of the back surface of the flexible display panel module;

a protection layer stacked on one side of the second adhesive layer away from the flexible display panel module; and a resilient layer stacked on one side of the protection layer away from the second adhesive layer, wherein the resilient layer is a stainless steel sheet.

2. The display module stack structure according to claim 1, wherein the polarization layer has a thickness of 100 μm to 110 μm in a direction perpendicular to the light-exiting surface and an elastic modulus of $2.0 \times 10^9$ pa to $2.8 \times 10^9$ pa.

3. The display module stack structure according to claim 1, wherein the first adhesive layer has a thickness of 45 μm to 55 μm in a direction perpendicular to the light-exiting surface and an elastic modulus of $3 \times 10^4$ pa to $3.6 \times 10^4$ pa.

4. The display module stack structure according to claim 1, wherein the protection cover plate has a thickness of 90 μm to 110 μm in a direction perpendicular to the light-exiting surface and an elastic modulus of $5.19 \times 10^9$ pa to $5.67 \times 10^9$ pa.

5. The display module stack structure according to claim 1, wherein the second adhesive layer has a thickness of 11 μm to 15 μm in a direction perpendicular to the light-exiting surface and an elastic modulus of $1.7 \times 10^5$ pa to $2.0 \times 10^5$ pa.

6. The display module stack structure according to claim 1, wherein the protection layer has a thickness of 45 μm to 55 μm in a direction perpendicular to the light-exiting surface and an elastic modulus of $3.0 \times 10^9$ pa to $3.5 \times 10^9$ pa.

7. The display module stack structure according to claim 1, wherein the resilient layer has a thickness of 90 μm to 100 μm in a direction perpendicular to the light-exiting surface and an elastic modulus of $1.6 \times 10^{11}$ pa to $1.9 \times 10^{11}$ pa.

8. The display module stack structure according to claim 1, wherein the second adhesive layer is made of at least one of a styrene-acrylonitrile copolymer, a styrene-isoprene-styrene block copolymer and a styrene-butadiene-styrene block copolymer.

9. The display module stack structure according to claim 1, wherein the protection layer is made of polyimide.

10. The display module stack structure according to claim 1, wherein the first adhesive layer is made of one or more of silicone, acrylic resin, unsaturated polyester, polyurethane and epoxy resin.

11. The display module stack structure according to claim 1, wherein the protection cover plate is a single-layer glass cover plate, a single-layer plastic cover plate, a lamination structure comprising at least two plastic film layers, or a lamination structure comprising a plastic substrate and a glass substrate.

12. The display module stack structure according to claim 1, wherein the flexible display panel module comprises a flexible display panel and a touch panel, and each of the flexible display panel and the touch panel comprises an inorganic film layer.

13. The display module stack structure according to claim 12, wherein the flexible display panel comprises a base substrate, an electroluminescent layer formed on the base substrate, and an encapsulation layer for encapsulating the electroluminescent layer, and the inorganic film layer is comprised at least in the encapsulation layer.

14. A display device, comprising the display module stack structure according to claim 1.

15. The display device according to claim 14, wherein the polarization layer has a thickness of 100 μm to 110 μm in a direction perpendicular to the light-exiting surface and an elastic modulus of $2.0 \times 10^9$ pa to $2.8 \times 10^9$ pa.

16. The display device according to claim 14, wherein the first adhesive layer has a thickness of 45 μm to 55 μm in a direction perpendicular to the light-exiting surface and an elastic modulus of $3 \times 10^4$ pa to $3.6 \times 10^4$ pa.

17. The display device according to claim 14, wherein the protection cover plate has a thickness of 90 μm to 110 μm in a direction perpendicular to the light-exiting surface and an elastic modulus of $5.19 \times 10^9$ pa to $5.67 \times 10^9$ pa.

18. The display device according to claim 14, wherein the second adhesive layer has a thickness of 11 μm to 15 μm in a direction perpendicular to the light-exiting surface and an elastic modulus of $1.7 \times 10^5$ pa to $2.0 \times 10^5$ pa.

19. The display device according to claim 14, wherein the protection layer has a thickness of 45 μm to 55 μm in a direction perpendicular to the light-exiting surface and an elastic modulus of $3.0 \times 10^9$ pa to $3.5 \times 10^9$ pa.

* * * * *